United States Patent [19]

Perko et al.

[11] Patent Number: 4,737,236
[45] Date of Patent: Apr. 12, 1988

[54] METHOD OF MAKING MICROWAVE INTEGRATED CIRCUITS

[75] Inventors: Richard J. Perko, Tempe, Ariz.; Alejandro Chu, Lexington, Mass.

[73] Assignee: M/A-COM, Inc., Burlington, Mass.

[21] Appl. No.: 904,947

[22] Filed: Sep. 8, 1986

[51] Int. Cl.$^4$ .............................................. H05K 3/00
[52] U.S. Cl. ..................................... 156/644; 156/654; 156/663; 156/901; 156/902; 156/651; 156/633; 156/659.1; 29/846
[58] Field of Search ............... 156/629, 633, 644, 654, 156/659.1, 663, 634, 645, 651, 656, 630, 901, 902; 29/574, 846; 174/68.5

[56] References Cited

U.S. PATENT DOCUMENTS

| | | | |
|---|---|---|---|
| 3,315,133 | 4/1967 | Walker | 156/629 |
| 4,181,249 | 1/1980 | Peterson et al. | 29/574 |
| 4,312,117 | 1/1982 | Robillard et al. | 156/644 |
| 4,418,470 | 12/1983 | Naster et al. | 29/576 B |
| 4,419,181 | 12/1983 | Tanaka et al. | 156/644 |

Primary Examiner—Kenneth M. Schor
Assistant Examiner—Lori-Ann Cody
Attorney, Agent, or Firm—Joseph H. Roediger

[57] ABSTRACT

A method of making a multiplicity of microwave integrated circuits is disclosed wherein a thin glass substrate is etched to contain both via holes and large area holes which receive discrete active devices therein. An electrically and thermally conductive carrier is adhered to one surface of the glass substrate with the electrical interconnections and circuit components formed on the opposing surface of the glass substrate. The method enables a multiplicity of microwave circuits to be made and tested by batch processing techniques prior to division into individual circuits.

9 Claims, 1 Drawing Sheet

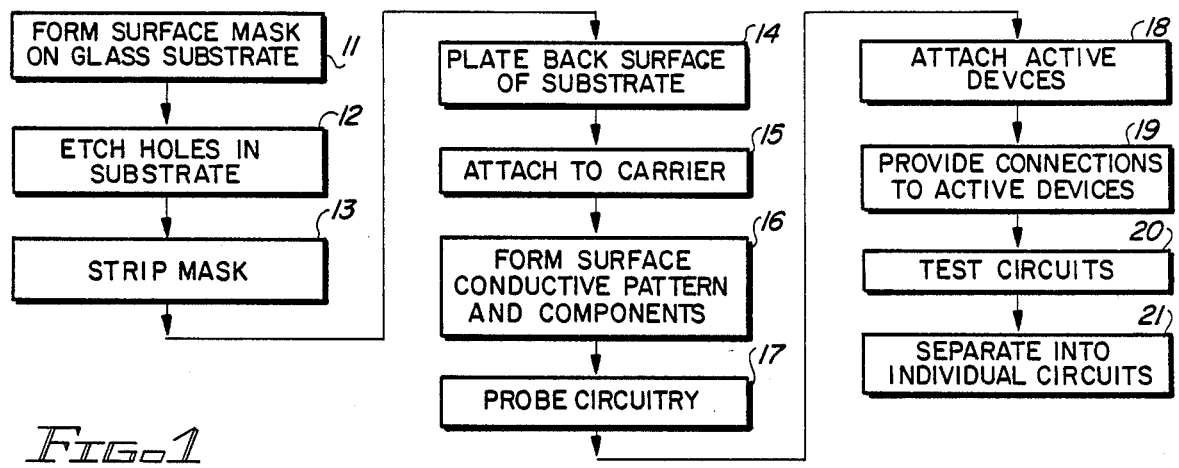
*Fig.1*
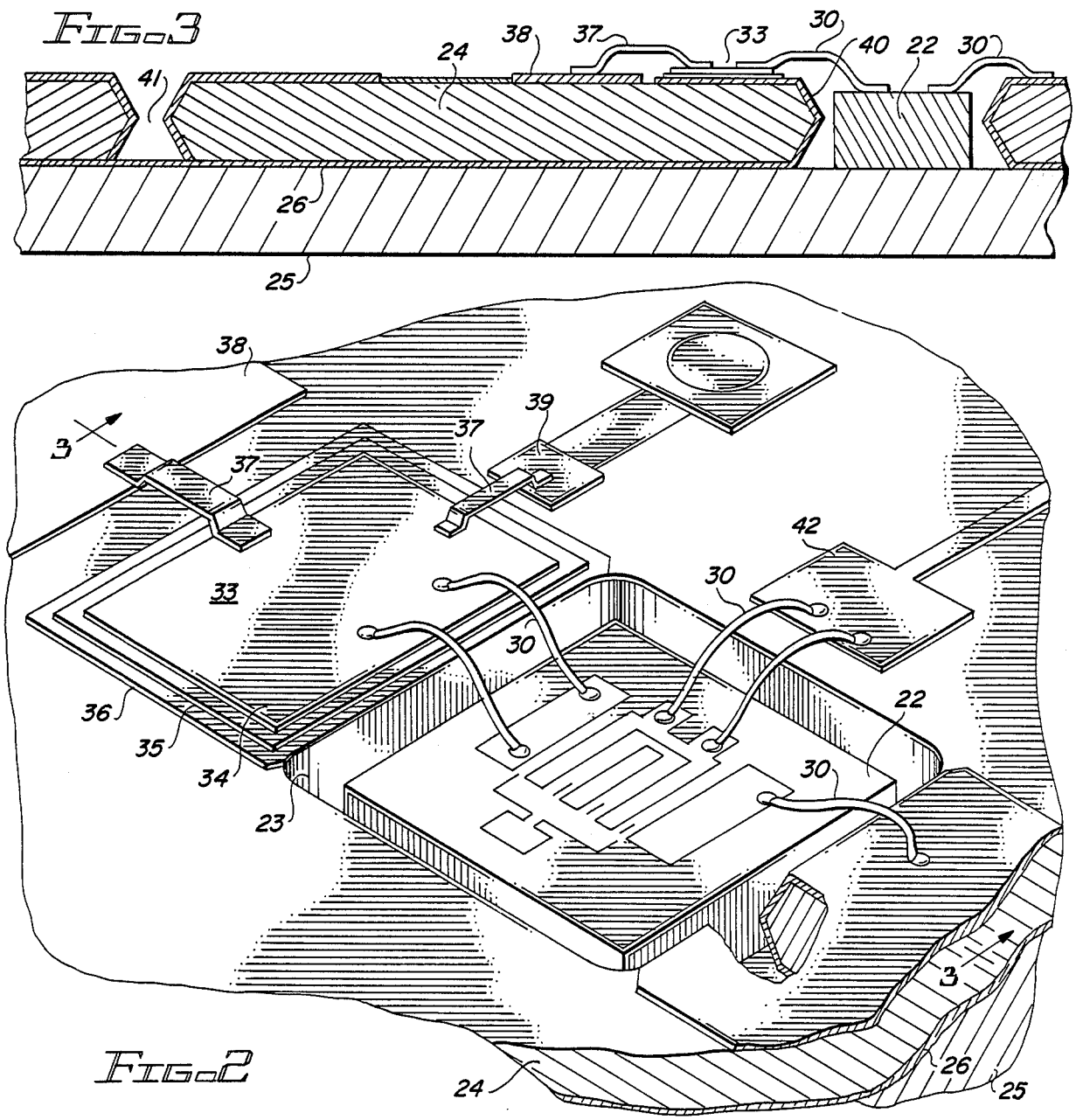
*Fig.3*
*Fig.2*

METHOD OF MAKING MICROWAVE INTEGRATED CIRCUITS

BACKGROUND OF THE INVENTION

This invention relates to a method of making electronic circuits, and in particular, to a method of making microwave circuits wherein a multiplicity of circuits are formed and tested in an integral structure, which includes a glass substrate, prior to division into individual circuits.

In the manufacture of integrated circuits, the production goals of low costs and high reproducibility are achieved through the use of fabrication processes using photolithographic techniques, whereby a multiplicity of circuits are fabricated in a single manufacturing sequence. This concept, referred to as batch processing, is used in the fabrication of semiconductor devices. The best example of the impact of batch processing in achieving low production costs is found in the silicon integrated circuit industry, where highly complex products are produced with a remarkably low unit cost.

The use of silicon (Si) integrated circuit technology is limited to low frequency applications (generally less than 1 GHz) by the limited electron mobility and low intrinsic resistivity of silicon. The low electron mobility limits the high frequency performance of the active semiconductor elements while the low bulk resistivity characteristic of the material creates high transmission losses at the higher microwave frequencies.

Gallium arsenide (GaAs) is presently used as an alternative semiconductor material for microwave integrated circuits. This material provides excellent results in many applications but it also possesses limitations which preclude its use in other important applications. The most important limitation of GaAs is the high cost of the basic wafer. GaAs wafers typically cost 20 to 100 times the cost of an equivalent silicon product. Further, many microwave circuits require large surface areas to accommodate the passive element structures and rely on extremely fine conductive pattern resolution during fabrication. As a result, the equivalent number of circuits available from a single wafer is often very low when compared with the number of low frequency silicon counter-parts obtained from the same size wafer. The material requirements lead to an unacceptable cost per circuit. In addition, many circuit designs require trimming, alignment or other adjustments after fabrication in order to compensate for variations in the characteristics of the active microwave devices sited in the individual circuits. Thus far there is no demonstrated effective technique, similar to the silicon manufacturing techniques, for accomplishing batch processing with GaAs mircowave integrated circuits.

Electronic components and subsystems are usually comprised of both low frequency and high frequency functions. Low frequency functions are ususally implemented using silicon devices and integrated circuits. High frequency functions in the microwave regime are usually implemented using GaAs diodes, FETs and integrated circuits. Because most applications require several Si and GaAs discrete devices or monolithic circuits, conventional hybrid technology has been used to incorporate these functions onto a single or multiple substrates (alumina, duriod, etc.).

To overcome the limitations associated with conventional hybrid technology, the trend in research has been to increase the level of integration and to investigate the integration of different devices on a single semiconductor substrate. Although impressive progress has been made in every area of investigation, near term applications require new manufacturing techniques for the implementation of ancillary functions associated with the utilization of discrete devices and monolithic circuits fabricated using different semiconductor substrate technologies. Glass substrate technology is capable of serving the above function with low cost and reproducibility features akin to those of monolithic circuit technology. Furthermore, the approach is capable of incorporating optical devices with low frequency and high frequency functions for use in novel opto-electronic components.

The conventional manufacturing technique for the fabrication of high performance hybrid microwave integrated circuits (HMIC) utilizes a low loss dielectric substrate for the placement of passive circuit elements in combination with packaged or unpackaged semiconductor chips thereon. The most commonly used substrate materials are alumina ($Al_2O_3$), beryllia (BeO) and fused silica ($SiO_2$). Most HMIC's utilize discrete chips for the capacitors as well as transistors. Hybrid circuits exhibit excellent performance characteristics and a high degree of flexibility but also require substantial labor for assembly. The high labor content leads to high fabrication cost and introduces unpredictable variations in component placement and bonding. These variations in assembly degrade the circuit's performance and highly skilled technicians are required to tune the rf circuit in order to attain consistent performance standards.

In the development of an improved low cost HMIC manufacturing process, the use of less expensive dielectric substrate materials which do not compromise circuit performance need to be considered. The fabrication process must allow passive circuit elements and their interconnections to be formed by batch processing techniques with high accuracy. Subsequent assembly and test procedures should be compatible with automation. The inability of present HMIC manufacturing techniques to utilize low cost substrates in an accurate and automated batch processing manufacturing sequence has resulted in the high cost of hybrid microwave integrated circuits. Especially when the cost is compared to that of silicon circuits fabricated by batch processing and testing.

Important requirements to be addressed in the fabrication of microwave integrated circuits are as follows: the substrate must have low loss microwave transmission characteristics; the conductive ground plane for the circuit must be accessible through short distances to provide low parasitic inductance to ground; the substrate must exhibit a smooth surface finish in order to provide a base for the fabrication of large area passive components using thin film techniques; and the active semiconductor devices must be mounted on a good thermal conductor to effectively provide adequate heat dissipation.

Present techniques for fabricating HMIC circuits utilize typically a 15-mil thick alumina substrate with a relative dielectric constant of 10. Ground connections are usually provided by small diameter via holes which are electroplated to the ground plane formed on the bottom surface of the substrate. The via holes are formed in the substrate by the use of a laser drilling. Alternatively, the holes can be drilled or punched mechanically in the substrate in the "green" state prior to sintering.

Laser drilling techniques generate splatter onto adjacent surface areas and result in the build-up of slag about the periphery of the hole. The accuracy attainable with laser drilling of small diameter holes is not acceptable for high density circuit fabrication. In addition, optically transparent substrate materials, such as fused silica, are extremely difficult to drill mechanically. In the case of small diameter hole formation while the substrate is in its "green" state, significant tolerance problems have been encountered as the dimensions and internal surface change as the material is sintered. Consequently, present hole formation techniques in substrates have resulted in reducing the yield and increasing the cost of microwave integrated circuits.

A micro-smooth surface is required for the fabrication of thin film capacitors. Since alumina and beryllia are polycrystaline materials with many grain boundaries and other surface defects, to produce a smooth surface, it is necessary to apply an amorphous glaze to the surface of the substrate. However, this approach has limited use due to the complexity of the process and difficulty in controlling the electrical characteristics of the resulting multi-layer dielectric substrate.

The need for a thermally conductive mounting surface for the unpackaged active devices in an HMIC usually requires attachment of active semiconductor devices on a metallic carrier placed below the dielectric substrates. Since the dielectric substrate is usually much thicker than the unpackaged active devices, either a machined metallic carrier or a separate mechanical processing step is necessary to raise the semiconductor device to the circuitry located on the upper surface of the substrate. It is desirable to limit the thickness of the substrate in order to reduce parasitic ground inductances in the circuit. Typically, common substrates with thicknesses on the order of 0.010 inches are very difficult to process due to breakage during handling. As a result, microwave circuits are manufactured today with specifications and techniques which trade off the various physical limitations of the materials against the performance and manufacturing costs.

Accordingly, the present invention addresses a method of manufacture wherein batch processing techniques can be used for the definition and formation of passive structural elements and subsequent assembly and testing of the microwave integrated circuit can be performed in an automated fashion prior to the separation of the substrate into a multiplicity of individual circuits. Thus, the heretofore practiced intermediate step of separating the substrate into individual circuits prior to location and attachment of the die containing the active semiconductor elements is eliminated.

Furthermore, the present method is well-suited for the use of thin substrate materials. In the prior art it is recognized that the thickness of the substrate is dictated in part by the dielectric constant of the substrate material. As the substrate thickness increases, the likelihood that present processing steps utilized for hole formation will result in damage to the substrate surface area proximate to the hole also increases since the time required to effect hole formation increases correspondingly. Also, the time in which undesired lateral effects can take place on the surface of the substrate increases. Accordingly, the present invention is directed to a novel method of making microwave integrated circuits, wherein a relatively thin substrate possessing a low dielectric constant is utilized in order to reduce the processing time required for hole formation. This invention further includes the step of chemically etching holes in the substrate to substantially reduce the undesired effects of present manufacturing techniques.

SUMMARY OF THE INVENTION

This invention relates to a method of making a multiplicity of individual microwave integrated circuits wherein the fabrication and assembly of integrated circuits is performed with batch processing techniques through the final testing step. The method employs a glass substrate which serves both as a low loss dielectric material for the transmission of energy at microwave frequencies and as the carrier for circuit components.

The present invention utilizes a glass substrate having first and second opposing surfaces with at least one of the surfaces having selected areas etched therein to form a multiplicity of openings extending through the substrate. The openings include small area via holes, and large area openings for the placement of active devices. The via holes are plated through to form ground connections between the ground plane formed on one surface and the conductive pattern formed on the opposing surface of the substrate. Next, an electrically and thermally conductive carrier is adhered to the opposing surface of the glass substrate. By attaching the glass substrate to the carrier early in the sequence of process steps, the following steps are performed on a mechanically rugged composite material thereby oermitting a relatively thin glass substrate to be used without significant breakage during circuit fabrication. Then, a multiplicity of electrical circuit components and an interconnecting conductive pattern is formed on at least one surface of the substrate. The provision of a functionally complete and rugged substrate prior to the attachment of active devices, wire bonding and testing, in the present method, eliminates the need to separate the individual circuits and subsequent mounting onto individual carriers for further processing. Next, a multiplicity of active devices are sited in the larger area openings of the glass substrate. The active devices are die-attached to the conductive carrier so as to be in heat-transfer relationship thereto rather than being sited on the upper surface of the substrate.

When the active devices are located in their respective openings, electrical interconnections between the electrodes of the active devices and the appropriate adjacent conductive pattern are formed using wire bonding techniques. Upon interconnection the circuits are fully functional and can be tested. Then, the substrate and carrier are divided into a multiplicity of individual microwave integrated circuits, each of which contains at least one active device or integrated circuit positioned therein. Thus, the entire fabrication process takes place with the large area substrate being maintained as an integral unit throughout the entire process. No subdivision takes place as heretofore practiced in the manufacture of conventional microwave integrated circuits. As a result, the fabrication process which is the subject of the present invention, eliminates operator-dependent steps thereby increasing yield, reducing cost and decreasing overall fabrication time.

Further features and advantages of the invention will become more readily apparent from the following detailed description of a specific embodiment thereof when taken in conjunction with the accompanying drawings.

BRIEF DESCRIPTION OF THE DRAWINGS

FIG. 1 is a block diagram showing major steps in the fabrication sequence as utilized in the present embodiment of the present invention;

FIG. 2 is a perspective view of a portion of an active device situated in the substrate in accordance with the present invention; and FIG. 3 is a cross-sectional view across line 3—3 of FIG. 2.

DESCRIPTION OF THE PREFERRED EMBODIMENT

The fabrication method, which is the subject of the present invention, is shown in the block diagram in FIG. 1. The fabrication sequence is comprised of steps represented by blocks through 21.

The fabrication of a microwave integrated circuit begins with a substrate with a smooth surface. In the practice of the present invention, the substrate is a glass substrate, preferably a borosilicate glass characterized by a dielectric loss tangent of less than 0.5% at 1 $GH_z$ and having a thickness within the range of 4 to 12 mils. Borosilicate glass has a relatively low dielectric constant and is commercially available from a number of manufacturers, for example the 7070 glass manufactured by Corning Glass Works which is capable of producing a micro-smooth surface "as fired" without mechanical lapping. The glass substrate provides a micro-smooth surface for thin film capacitor fabrication and possesses sufficient structural integrity to withstand the rigors of the subsequent limited processing techniques. In particular, the substrate is then masked, etched to form the hole pattern and then subjected to a plating process on one side thereof.

Initially, the thin glass substrate has a mask formed thereon configured in accordance with the topographical features desired for subsequent steps. Typically, the mask is formed by sputtering a metallic film thereon which is then subject to selective removal thereby forming the desired pattern. The following step of the process is directed to the removal of material from the unmasked portions of the substrate by the etching of holes therethrough. The etching process is directed to etching the smaller diameter via holes, which are later plated through to provide interconnection between conductive members on either side of the substrate, and the large diameter holes, which will accommodate the placement of active devices therein in a later processing step. In practice, the etching is provided by a wet-chemistry step utilizing a hydroflouric acid etchant, preferably etching from both sides of the substrate. The masking of both sides of the substrate shortens the time required for hole formation and thus reduces the lateral etching of the sidewalls in the opening due to undercut of the masking layer. Upon completion of the etching process, the mask is removed from both surfaces of the substrate, as noted in block 13.

The underside of the substrate is then electroplated with gold to form the ground plane for microstrip transmission lines. The thickness of the electroplated gold layer is typically on the order of 1-2 microns. This layer provides both good electrical and mechanical contact with the carrier, which will be affixed to the back side of the substrate. In block 15, the carrier is attached to the substrate. In the present embodiment the carrier is a highly doped P or N type silicon wafer with resistivities in the range of 0.005 to 0.15 ohm-cm and thickness of 10-30 mils. The carrier is selected to match the expansion characteristic of the glass over the temperature range of interest and exhibits high thermal and electrical conductivity. The carrier also provides mechanical strength to reduce breakage of the thinner glass substrate in subsequent process steps. Other carrier materials found suitable for use in the present invention composites which exhibit good thermal match to semiconductor materials, high electrical and thermal conductivities. Attachment of the substrate to the carrier is obtained by coating the carrier with a thin layer of gold and placing the carrier in contact with the gold on the substrate. The substrate is bonded to the carrier by heating the assembly to 370° C., which is the AuSi eutectic temperature.

Following the attachment of the plated surface of the substrate to the carrier, additional coating and masking steps are carried out on the exposed surface of the substrate to form the conductive pattern for the circuits and passive components. Provisions are made to include thin film resistors, capacitors and inductors. Typically, a sequence of conventional photolithographic steps is utilized to form the components and their interconnecting pattern. Upon completion of the formation of passive components and their interconnections, the circuit is probed using automatic test equipment to insure that the components exhibit the desired electrical characteristics.

Upon completion of the tests, active chips, typically gallium arsenide devices, are placed within the large area openings in the substrate and attached to the conductive carrier. Die attachment can be performed using different techniques. The base of the active device is adhered to the conductive layer on the carrier by the use of a conductive epoxy, for example, a silver-filled epoxy such as "36-2" manufactured by Ablestick Laboratories may be used, to insure good electrical contact and thermal contact with the carrier. Alternatively, a suitable solder alloy such as Au-Sn may also be used. Upon die-attach of the active devices, thermo-compression bonding is used to connect the devices to suitable bonding pads which are part of the circuitry fabricated on the substrate. At this point, the circuits can be tested using automatic testing equipment. The electrical tests are designed in accordance with rf specifications. Following the recording of the test results, the large area substrate is divided into a multiplicity of individual microwave integrated circuits. Because the relative positions of the individual circuits formed on this large area glass substrate are maintained through the entire manufacturing process, wire bonding and test can be readily automated using existing automatic equipment.

In contrast, conventional processes utilized in the manufacture of hybrid microwave integrated circuits require the division of substrates prior to the placement and attachment of the die in the circuit. As a result, each microwave integrated circuit is formed as an individual unit after the generation of the circuit passive components and conductive pattern. After division of the substrate in the prior processes, each individual circuit, less its active element, is then attached to a carrier. Then, the die attachment and wire bonding steps are performed on the individual units. For those reasons, the present invention provides a processing method for the manufacture of microwave integrated circuits at reduced cost and higher yield.

One embodiment of a microwave circuit constructed in accordance with the method which is the subject invention is shown in the partial section view of FIG. 2 wherein a semiconductor die 22 containing an active device, for example, a gallium arsenide transistor and associated circuitry, is shown located in a large area opening of a borosilicate glass substrate 24 having a thickness of 10 mils. As noted from FIG. 3, the active device 22 is attached to the ground plane 26 formed on the upper surface of carrier 25. Wire bonds 30 extend from adjacent bonding pads and passive components across the space between the vertical wall of the substrate and the active device connecting appropriate bonding pads located on the upper surface of the unpackaged active device. In the embodiment shown, the carrier 25 is highly doped silicon and the ground plane 26 is a gold layer formed thereon and upon which borosilicate glass substrate 24 is adhered. The sidewalls 40 of the opening 23, which is chemically etched into the glass substrate 24, are shown slanted inwardly toward the center of the hole as a result of being chemically etched from both sides of the substrate.

A via hole 41, having a relatively small diameter, is shown in FIG. 3 and extends through the glass substrate 24. Both the large diameter hole 23 which accommodates the active device 22 and the small via hole 41 are provided with what is termed wrap-around metalization to bring the circuit ground to the top surface of the integrated circuit. A capacitor 33 is formed on the substrate surface and includes bottom electrode 36 which is connected to the metal layer extending downwardly through opening 23, dielectric layer 35 formed thereon and top electrode 34 which serves as a bonding pad not only for the wire bonds 30 but also for the interconnections 37 to adjacent bonding pads 38 and 39. A typical bonding pad 42 for interconnection to other circuit areas is shown in FIG. 2.

In the practice of the present method, glass substrate 24 is masked, etched and the mask removed as an integral large area substrate for a multiplicity of individual microwave integrated circuits. Each individual microwave integrated circuit formed thereon may include more than one active device and associated via holes. The layout and topography of the individual circuits comprises no part of the present invention since it is unique to the particular application and does not alter the process technology. Upon completion of the formation of the circuits on the substrate upper surface and the adherence of the carrier to the opposing surface, the substrate is divided into individual circuits utilizing a conventional saw for semiconductor materials. The individual microwave integrated circuit can then be incorporated into higher level assemblies or packaged for individual use.

While the foregoing description has referred to a specific embodiment of the invention, it is recognized that many modifications and variations may be made therein without departing from the scope of the invention as claimed.

What is claimed is:

1. A method of making a multiplicity of individual microwave integrated circuits wherein a glass substrate is utilized both as a dielectric material for the transmission of microwave energy and as a fabrication base for circuit components, said method comprising the following steps:
   (a) etching selected areas of at least one surface of a thin glass substrate having a thickness within the range of 4 to 12 mils and including first and second opposing surfaces to form a multiplicity of openings extending therethrough;
   (b) adhering an electrically and thermally conductive carrier to said first or second opposing surface of said glass substrate;
   (c) forming a multiplicity of conductive patterns on said at least one surface of the substrate;
   (d) placing active devices within selected openings of said multiplicity of opening said substrate;
   (e) affixing said active devices to said conductive carrier in heat transfer relationship thereto;
   (f) forming electrical interconnections between each of said active devices and an adjacent portion of the conductive pattern located on said at least one surface of the substrate; and
   (g) dividing said substrate and carrier into a multiplicity of individual integrated circuits containing active devices positioned therein.

2. The method of claim 1 wherein said initial step comprises:
   (a) etching selected areas of said thin glass substrate to form a multiplicity of small and large diameter openings, said large diameter openings receiving active devices therein.

3. The method of claim 2 further comprising the steps of:
   (a) locating a mask on said one surface of the glass substrate to define a multiplicity of masked areas thereon; and
   (b) chemically etching said unmasked areas to form small and large diameter openings extending through the glass substrate prior to adhering said carrier to the opposing surface of said substrate.

4. The method of claim 3 further comprising the steps of locating masks on both surfaces of said substrate and then chemically etching unmasked areas on both surfaces of said glass substrate.

5. The method of claim 4 wherein the step of adhering a conductive carrier to said layer comprises: adhering a metal composite carrier to said opposing layer to form a structure for subsequent fabrication steps.

6. A method of making a multiplicity of individual microwave integrated circuits wherein a glass substrate is utilized both as a dielectric material for the transmission of microwave energy and as a fabrication base for circuit components, said method comprising the following steps:
   (a) etching selected areas of at least one surface of a glass substrate having first and second opposing surfaces to form a multiplicity of openings extending therethrough;
   (b) plating a conductive layer on said first or second opposing surface of said glass substrate;
   (c) adhering an electrically and thermally conductive carrier to said layer;
   (d) forming a multiplicity of conductive patterns on said at least one surface of the substrate;
   (e) placing active devices within selected openings of said multiplicity of openings in said substrate;
   (f) affixing said active devices to said conductive carrier in heat transfer relationship thereto;
   (g) forming electrical interconnections between each of said active devices and an adjacent portion of the conductive pattern located on said at least one surface of the substrate; and
   (h) dividing said substrate and carrier into a multiplicity of individual integrated circuits containing active devices positioned therein.

7. The method of claim 6 wherein said initial step comprises:
   (a) etching selected areas of at least one surface of a thin glass substrate having a thickness within the range of 4 to 12 mils to form a multiplicity of openings extending therethrough.

8. The method of claim 6 wherein the step of adhering a conductive carrier to said layer comprises:
   (a) placing a carrier formed of a semiconductor material and having a thickness at least as large as the glass substrate in contact with said layer; and
   (b) adhering said carrier to said layer and glass substrate.

9. The method of claim 6 wherein the step of adhering a conductive carrier to said layer comprises:
   (a) plating a metallic layer on said opposing layer; and
   (b) adhering a highly-doped silicon carrier, a metal composite or other carrier material thereto to form a structure for subsequent fabrication steps.

* * * * *